United States Patent [19]

Sevastopoulos

[11] Patent Number: 4,857,860

[45] Date of Patent: Aug. 15, 1989

[54] CLOCK-SWEEPABLE LOW-PASS FILTER HAVING DC GAIN ACCURACY AND REDUCED DC OFFSET

[75] Inventor: Nello G. Sevastopoulos, San Jose, Calif.

[73] Assignee: Linear Technology Corporation, Milpitas, Calif.

[21] Appl. No.: 202,952

[22] Filed: Jun. 6, 1988

[51] Int. Cl.$^4$ .............................................. H03F 1/34
[52] U.S. Cl. ................................. 330/107; 307/520; 330/9
[58] Field of Search .................. 330/9, 51, 107, 109, 330/294, 302, 306; 307/520

[56] References Cited

U.S. PATENT DOCUMENTS 4,453,143  6/1984  Bennett ........................ 330/107 X
4,783,635  11/1988  Sevastopoulos .................. 330/107

Primary Examiner—Steven Mottola
Attorney, Agent, or Firm—Flehr, Hohbach, Test, Albritton & Herbert

[57] ABSTRACT

A switched capacitor filter having DC gain accuracy and low DC offset includes an operational amplifier with a resistor (or switched capacitor) connecting one input of the operational amplifier to a signal input terminal. A first capacitor provides a first feedback loop between the output and an input of the operational amplifier, and an active network is serially connected with another resistor (or switched capacitor) as a filtered feedback loop.

3 Claims, 2 Drawing Sheets

DC BEHAVIOR

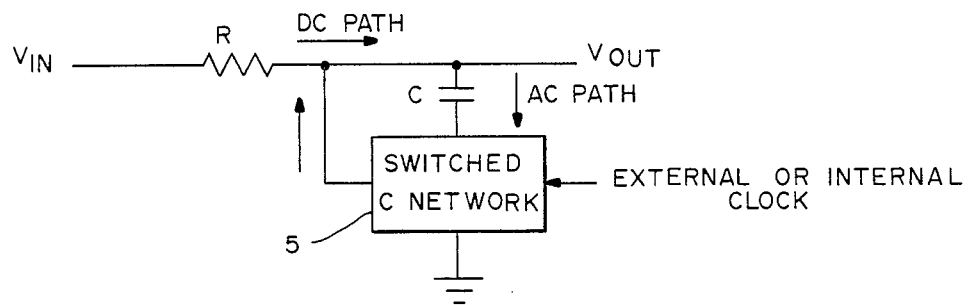
FIG.—1
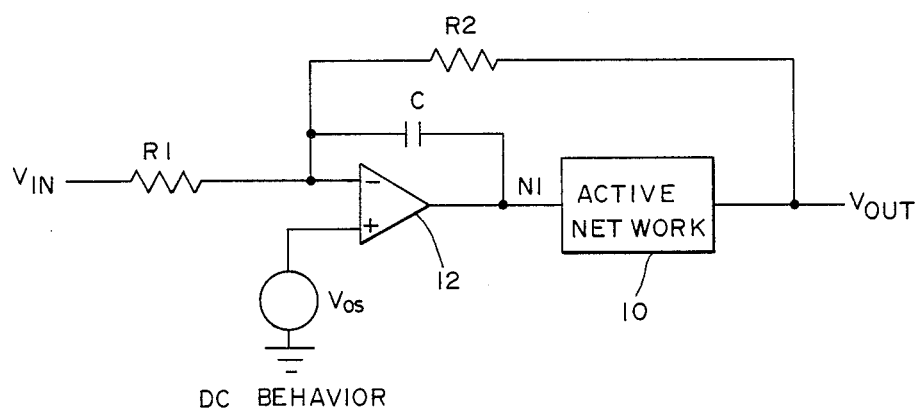
FIG.—2
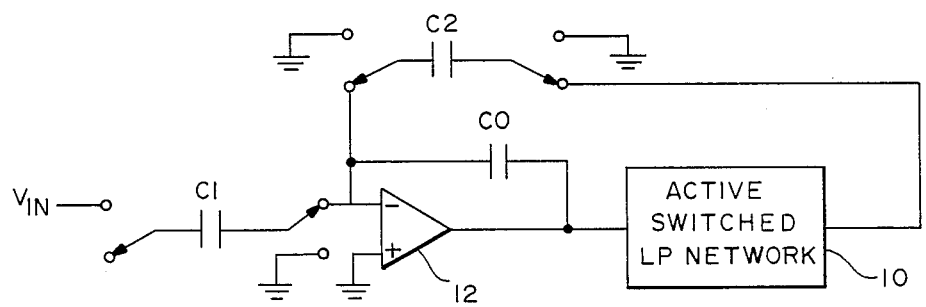
FIG.—3

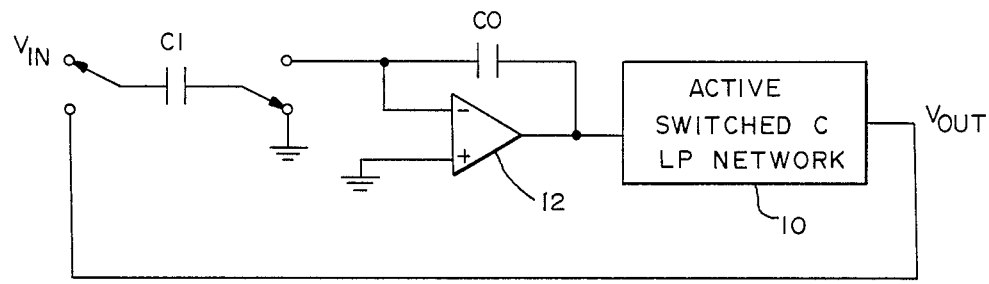
FIG.—4
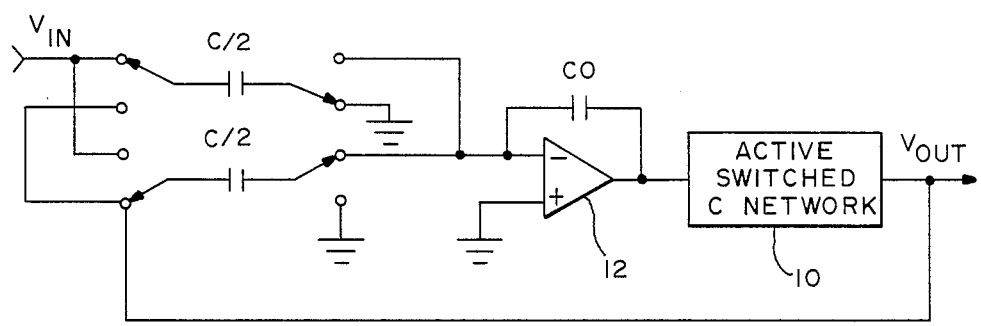
FIG.—5

CLOCK-SWEEPABLE LOW-PASS FILTER HAVING DC GAIN ACCURACY AND REDUCED DC OFFSET

BACKGROUND OF THE INVENTION

This application is related to co-pending application Ser. No. 909,973 filed Sept. 22, 1986 for LOW PASS FILTER, now U.S. Pat. No. 4,783,635.

This invention relates generally to low-pass electrical filter circuits, and more particularly the invention relates to a switched capacitor low-pass filter utilizing an active network to improve gain roll-off and DC gain accuracy.

A passive low-pass filter consisting of resistor and capacitor elements exhibits a gain function having significant roll-off; i.e., the filtering of high-frequency signal components occurs generally as a function of frequency. Active filters, or filters including active components, improve the passband flatness of passive circuits, provide DC gain, but introduce DC offset errors in the output signal.

Disclosed in co-pending application Ser. No. 909,973, supra, is a low-pass filter having improved DC offset and DC gain accuracy. As shown in FIG. 1 herein, the filter effectively includes a switched capacitor network in series with a shunt capacitance element of a passive low-pass filter. To obtain a maximally flat network, the cut-off frequency of a low-pass filter should be closely related to the external RC elements, or $$F_{cutoff} = \frac{1.63}{2\pi RC}$$

Since the overall filter cutoff frequency depends on the switched capacitor network clock's frequency, when the external or internal clock frequency changes, the filter response loses its shape and may even stop functioning. Therefore, to correctly tune the circuit, one has to choose an external R,C network to satisfy the above relation to each clock frequency.

SUMMARY OF THE INVENTION

An object of the present invention is an active low-pass filter in which DC offset depends only on the offset introduced by an input operational amplifier.

Another object of the present invention is an active low-pass filter which can be implemented with a switched capacitor equivalent circuit where the circuit can be swept with a single clock frequency and maintain DC gain accuracy.

Still another object of the present invention is an active low-pass filter in which the input RC time constant can be algorithmically combined with the coefficients of the active network to perform a desired all-pole low-pass filter.

Briefly, in accordance with the invention, an active network in placed in the feedback loop of an operational amplifier whereby DC output offset depends only on the offset of the input to the operational amplifier. The resistive and capacitive passive elements external to the active network can be readily modified into a switched capacitor equivalent circuit, whereby the entire circuit can be swept with a single clock frequency to alter the filter cut-off frequency while maintaining DC gain accuracy. Further, the external resistive and capacitive elements can be combined with the coefficients of the active network to perform a Bessel, Butterworth, Chebyshev, or other all-pole low-pass function.

The invention and objects and features thereof will be more readily apparent from the following detailed description and appended claims when taken with the drawing.

BRIEF DESCRIPTION OF THE DRAWING

FIG. 1 is a functional block diagram of a low-pass filter including a switched capacitor shunt network as disclosed in co-pending application Ser. No. 909,973, supra.

FIG. 2 is a functional block diagram of a low-pass filter in accordance with the present invention.

FIG. 3 is a schematic of the low-pass filter of FIG. 2 utilizing switched capacitor elements.

FIG. 4 is a schematic of another embodiment of the low-pass filter of FIG. 2 using switched capacitor elements.

FIG. 5 is a schematic of another embodiment of the low-pass filter of FIG. 2 using switched capacitor elements.

DETAILED DESCRIPTION OF ILLUSTRATIVE EMBODIMENTS

FIG. 1 is a schematic of a low-pass filter including an active switched capacitor network as disclosed in co-pending application Ser. No. 909,973, supra. As shown, the switched capacitor network 5 is a serially connected with capacitor C as a shunt to ground and provides the AC path for filtered high-frequency signal components. The DC path is from the input through the resistor R to the output. The switched capacitor network is clocked by either an external or an internal clock.

FIG. 2 is a schematic of a low-pass filter in accordance with the present invention which utilizes an active network 10 in the feedback loop of an operational amplifier 12. The input signal, $V_{in}$, is applied through resistor R1 to one input of the operational amplifier 12, and the DC voltage offset is schematically illustrated as applied to the other input of the operational amplifier 12. The op amp feedback loop includes a capacitor C and a resistor R2 which are respectively connected to terminals of the active network 10.

For a DC signal, the impedance of the capacitor C is infinite and, if it is assumed that the DC gain of the operational amplifier is also infinite, then the gain at the output is $$\frac{V_{out}}{V_{in}} \text{ freq} = 0 = -\frac{R2}{R1} \text{ (filter DC gain)}$$

The output DC offset depends only on the operational amplifier offset, $V_{os}$, and it does not depend on the DC offset of the active network inside the loop. The total offset is $$V_{os} \text{ (output)} = \left(1 + \frac{R_2}{R_1}\right) \times V_{os}$$

Considering AC behavior, if the transfer function of the active network is $$\frac{V_{out}}{V_{in}} = G$$

then the overall gain function of the circuit is $$-\frac{V_{out}}{V_{in}} = \frac{R_2}{R_1}\left(\frac{G}{G+sT}\right)$$

where $s = jw$, $T = R_2C$,

It can be seen, at DC $$\frac{V_{out}}{V_{in}} = -\frac{R_2}{R_1}.$$

Consider now an all-pole (Butterworth, Chebyshev, Bessel) low-pass filter. The normalized transfer function of an all-pole low-pass filter is $$G_{LP} = \frac{C_o}{s^n + C_{n-1}s^{n-1} + \ldots + c_1 s^o + c_o} \quad (1)$$

If the transfer function of the active network is $$G = \frac{b_o}{s^{n-1} + b_{n-2}s^{n-2} + b_{n-3}s^{n-3} + \ldots + b_1 s^o + b_o}$$

The transfer function of the circuit of FIG. 2 for $R_2 = R_1$ is:

$$-\frac{V_{out}}{V_{in}} = \frac{\omega_{real} b_o}{\omega_{real} b_o + s^n + bn - 2 s^{n-1} + bn - 3 s^{n-2} + b_1 s^2 + b_o s} \quad (2)$$

Equating the coefficients between (1) and (2)

| | | | |
|---|---|---|---|
| $\omega_{real} b_o = C_o$ | | $\omega_{real} = C_o/C_1$ | |
| $bn - 2 = Cn - 1$ | | $bn - 2 = Cn - 1$ | |
| $bn - 3 = Cn - 2$ | $\rightarrow$ | $bn - 3 = Cn - 2$ | |
| . | | . | |
| . | | . | |
| . | | . | |
| $b_o = C_1$ | | $b_o = C_1$ | |

From the above it is seen that methodology is straightforward IN that all one need to do is to design a "non textbook" active low-pass network whose transfer function is:

$$G = \frac{C_1}{s^{n-1} + s^{n-2}(C_{n-1}) + s^{n-3}(Cn - 2) + \ldots + sC_2 + C_1}$$

where all the C coefficients are the coefficients for textbook theoretical all-pole low-pass filters such as found in Allen et al. Switched Capacitor Circuits, Van Nostrand Reinhold Company. The external $R_2C$ time constant is chosen so that as $$\frac{1}{R2C} = \frac{C_o}{C_1}$$

with again ($C_{o1}$, $C_1$) being the last two coefficients of an ideal low-pass filter polynomial.

As described in the circuit of FIG. 2, in accordance with the invention the active network is placed in the DC and AC loop. For DC current, the high open-loop gain of the op amp forces the output DC offset to depend uniquely on the op amp internal offset. Further, the DC gain of the circuit is forced to be independent of the DC gain of the active network. When the function of the circuit is desired to be a conventional high-order all-pole low-pass filter, the design of the internal active network is routine.

Since the input structure of the amplifier of FIG. 2 is an inverting amplifier/integrator, the resistors and capacitor can be fabricated using switched capacitor techniques, as illustrated in the schematic of FIG. 3. Further, the internal active network can comprise switched capacitor circuitry. A clock will drive both the integrator and the internal switched capacitor network, whereby the entire circuit can be swept with a single clock. In the circuit of FIG. 3, one terminal of the capacitor C1 is alternately switched between $V_{in}$ and ground while the other terminal of the capacitor C1 is switched between ground and one input of the operational amplifier 12. The resistive element $R_2$ of the circuitry of FIG. 2 is replaced by a switched capacitor $C_2$ which is alternative switched in the feedback loop and grounded. For unity DC gain, $C_1 = C_2$ and the DC gain is expressed as $C1/C2 \pm$ capacitance tolerances.

The input switched capacitor $C_1$ is inverted so that the overall DC gain of the circuit is noninverting.

The switched capacitor $C_1$ of FIG. 3 can perform the functions of resistor R1 and resistor R2 of FIG. 2, as illustrated in FIG. 4. One obvious improvement utilizing the circuit of FIG. 4 is the DC gain of the overall filter is equal to unity.

FIG. 5 is another embodiment of the circuit of FIG. 2 and represents a refinement of the circuitry of FIG. 4. In this embodiment the amount of time the overall loop is open is minimized by utilizing a double switching scheme using two capacitors, C/2, to replace the single capacitor $C_1$ of FIG. 4.

There has been described several embodiments of an active low-pass filter where the DC offset depends only on the offset introduced by an input operational amplifier. The filter can be implemented as a switched capacitor or equivalent circuit where the circuit can be swept with a single clock frequency and maintain DC gain accuracy. The RC time constant elements can be algorithmically combined with the coefficients of a high-order multiple-pole filter.

While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. A filter circuit comprising
   an operational amplifier having first and second inputs and an output,
   a first resistive means connecting a signal input terminal to said first input,
   means for grounding said second input,
   capacitive means interconnected between said output and said first input,
   an active low-pass filter network having an input and an output, said low-pass filter network comprising an all-pole filter having a transform function based in part on said first resistive means, said capacitive means, and a second resistive means, means connecting said input of said active filter network with said output of said operational amplifier,
said second resistive means connecting said output of said active filter network to said first input of said operational amplifier.

2. The filter circuit of claim 1 wherein said first resistive means and said second resistive means comprise switched capacitors and said active filter network includes switched capacitors.

3. A filter circuit comprising
an operational amplifier having first and second inputs and an output,
a first capacitive means connected between said first input and said output,
an active switched capacitor filter network having an input and an output,
means connecting said input to said active switched capacitor filter network to said output of said operational amplifier,
a second capacitive means having first and second terminals,
a first switch means for alternately switching said first terminal of said second capacitive means between a switched capacitor filter network, and
a second switch means for alternately switching said second terminal of said second capacitive means between said first input to said operational amplifier and ground,
wherein said second capacitive means includes first and second capacitors each having first and second terminals, said first switch means alternately connecting terminals of said first and second capacitors to a signal input terminal and said output of said active switched capacitor filter network, and said second switch means alternately connecting terminals of said first and second capacitors to said first input to said operational amplifier and ground.

* * * * *

UNITED STATES PATENT AND TRADEMARK OFFICE
CERTIFICATE OF CORRECTION

PATENT NO. : 4,857,860

DATED : August 15, 1989

INVENTOR(S) : Nello G. Sevastopoulos

It is certified that error appears in the above-identified patent and that said Letters Patent is hereby corrected as shown below:

In the Drawings:

In Figure 2, change "NI" to --VI--.

In Figure 3, the floating node of the input switch should be grounded.

Signed and Sealed this

Seventh Day of April, 1992

Attest:

HARRY F. MANBECK, JR.

*Attesting Officer*  *Commissioner of Patents and Trademarks*